Dec. 29, 1959 E. M. VAN WAGNER 2,919,179

RESIST FORMING METHOD

Filed May 21, 1956

INVENTOR.

EDWARD M. VAN WAGNER

BY Frank A. Steinhilper

ATTORNEY

United States Patent Office 2,919,179
Patented Dec. 29, 1959

2,919,179

RESIST FORMING METHOD

Edward M. Van Wagner, Rochester, N.Y., assignor to Haloid Xerox Inc., Rochester, N.Y., a corporation of New York Application May 21, 1956, Serial No. 586,033

14 Claims. (Cl. 41—43)

This invention relates to the art of xerography as applied to the formation of predetermined patterns of resist material on support surfaces, and, particularly, to the formation of such resist material patterns for use in the preparation of printed circuits.

Heretofore, a variety of methods have been proposed for forming various types of resist material patterns for use in applications such as painting, metal spraying, electro-plating, anodizing, sandblasing, etc. The resist materials themselves may be of any desired kind in order to provide the required degree of chemical, thermal or physical resistance, in accordance with the type of manufacture involved. The resist is generally formed in the nature of a stencil, frequently employing silk screen, metal screen, or similar techniques, or by offset printing, or by any other convenient method. In addition, any of these techniques may be combined with photographic techniques employing photosensitive resist materials whereby exact replicas of a predetermined pattern may be made.

The resist may be formed as a partial or selectively applied overcoating on a uniformly surfaced support from which it is desired to remove the portions of the surface material that are not covered by the resist material. Alternatively, the resist pattern may be formed on a support surface, and the final pattern material may be applied thereto by painting, spraying or chemical deposition techniques, or by vacuum processes such as cathode sputtering or evaporation. In any of these processes the undesired portion of the final pattern may be removed by chemical etching, sandblasting or abrading, grinding or milling, heat fusion, or other suitable means, in accordance with type of materials employed and the desired nature of the final surface. The particular combination of steps and techniques involved in any process are specifically selected in accordance with the cost, quantity, accuracy and durability factors to be attained in the finished product.

Although many such processes are in wide commercial use and produce acceptable results for the purposes intended, all known processes require the expenditure of a great deal of time and skill to form the outline of the particular pattern that is to be reproduced. In addition, when accuracy of detail is significant, it is practically essential to incorporate photographic techniques in the process in order to attain a reasonable degree of reproducibility. The introduction of photographic techniques further complicates any process of this type because of the need for photosensitive supplies, photo-processing equipment, and darkroom facilities.

Recently, in connection with the development of the newly discovered art of xerography, it has been found that certain xerographic techniques may be modified and adapted to the formation of resist material patterns in a manner substantially to decrease the time, skill, and equipment requirements of existing resist forming techniques. Although the art of xerography, in its basic concept, is directed primarily to the reproduction of printed matter, as such, it has been found that conventional xerographic apparatus may readily be adapted, in accordance with the method of the present invention, to the preparation of photographically exact patterns of resist material at a substantial saving of time and without the requirement for photo-chemical processing or darkroom facilities. It will be readily apparent that such xerographic apparatus and the method of the invention may be widely applied to various applications involving the formation of resist patterns. However, the description herein is limited, by way of example, to the application of the invention to the production of printed circuits.

In recent years the manufacture of printed circuits or wiring boards has been the subject of extensive research and development work that has resulted in a wide variety of new techniques and processes for forming such circuits quickly, accurately, and with the proper electrical and physical characteristics. In most processes presently in quantity production, it is customary to form a pattern of resist material corresponding to a conductive network on a conductively coated support surface and to etch away the exposed areas of the conductive coating, thereby leaving the remaining portion of the conductive coating the form of the desired conductive network under the resist material. Subsequently, the resist material is removed from the conductive network which may then be installed, with its support surface, as an element of an electrical circuit. Passive circuit elements such as resistors, capacitances and inductances may be added to the circuit either as independent units or by further applications of printed circuit-forming techniques. In general, the conductively clad support surface comprises a layer of copper, silver or other metallic foil bonded to a plastic, glass or ceramic support material, whereby the resulting conductive network has the desired electrical characteristics, and has sufficient rigidity to permit handling during manufacture and to be self-supporting in its ultimate environment.

Basically, the method of the present invention is directed to forming a pattern of chemically inert plastic on a support surface wherein an electrostatic latent image of the resist pattern is first formed on a xerographic plate and is then developed with a chemically inert plastic powder to form a powder image of the pattern on the plate. Thereafter, the support surface is superposed on the powder image and is positively charged while in contact with the plate to effect electrostatic transfer of the bulk of the powder image to the support surface. The support surface with the partial powder image thereon is then separated from the xerographic plate, and the residual powder image remaining on the plate is negatively charged. The support surface is then again superposed on the plate with its partial powder image in register with the residual powder image on the plate, and the support surface is again positively charged to effect electrostatic transfer of the residual powder image to the support surface. Finally, the support surface with the complete powder image thereon is separated from the plate, whereby a pattern of resist material corresponding to the desired pattern and comprising substantially the entire powder image is formed on the support surface. Generally, the plastic powder employed as a developing agent is of the thermoplastic type whereby it may be fused by the application of heat or solvent vapor to form a coherent and impervious resist surface that is firmly adhered to the support.

As applied to the manufacture of printed circuits in which a conductive network of predetermined pattern is to be formed on a support surface by forming a pattern of resist material corresponding to the predetermined pattern on a conductively coated support and etching away the exposed areas of the conductive coating, the method of the invention comprises forming an electrostatic latent image of the pattern on a xerographic plate, developing the latent image with a powdered resist material to form a powder image of the pattern on the plate, superposing an intermediate transfer sheet on the powder image, electrostatically transferring the bulk of the powder image to the transfer sheet, separating the transfer sheet and the powder image thereon from the xerographic plate to an extent to expose the residual powder image on the plate, electrostatically charging the residual powder image to a polarity opposite to that employed in the transfer step, again superposing the transfer sheet on the residual powder image, electrostatically transferring the residual powder image to the transfer sheet, separating the transfer sheet with the complete powder image thereon from the plate, and transferring the powder image to a conductively coated support surface. As above, the powder image may then be fused to form an impervious resist pattern that is adhered to the conductive coating of the support surface.

The principal object of the invention is to provide an improved method for forming resists. A further object is to provide an improved method for forming photographically exact resists without need for photo-processing equipment or darkroom facilities. A further object is to provide an improved method to form resist patterns that are completely impervious and chemically inert, and are photographic reproductions of original copy. A further object is to provide a method for forming extremely dense, photographically exact resist patterns by xerographic techniques. A further object is to provide an improved method for forming printed circuits by the application of xerographic techniques.

These and other objects of the invention are attained by modifications of existing xerographic developing techniques whereby the residual powder image usually left on a xerographic plate after image transfer may be independently charged and transferred additively to the first transferred image to form an extremely dense powder image on the transfer surface which, after fusing, forms a completely impervious, chemically inert resist pattern that is a photographic reproduction of the original from which it was made.

A preferred form of the invention is disclosed in the appended drawings, in which.

Before considering the specific details of the method of the present invention, it is preferred briefly to discuss the basic xerographic process and the processing equipment with which such method may most conveniently be practiced. In a general application of the process of xerography, as disclosed in Carlson Patent 2,297,691, issued October 6, 1942, a xerographic plate assembly comprising a coating of photoconductive insulating material on a conductive backing is given a uniform electric charge over its surface and is then exposed to the subject matter to be reproduced, usually by conventional photographic techniques such as by camera, projection, or contact exposure, depending upon the type of application. This exposure discharges the plate areas in accordance with the light intensity which reaches them, thereby creating an electrostatic latent image on or in the plate coating. Development is effected with a finely divided material, such as an electroscopic powder, which is brought into contact with the coating and is held thereon electrostatically in a pattern corresponding to the electrostatic latent image. Finally, the powder image is transferred to a suitable base, such as paper, and is fixed thereon by fusion or by use of a solvent, in accordance with the type of developing material employed.

A conventional form of xerographic plate assembly currently in wide commercial use is disclosed in Mayo Patent 2,619,418, issued November 25, 1952, and comprises a xerographic plate that is secured in a rectangular plate holding frame which is also provided with suitable recessed grooves to accommodate a dark slide to shield the plate from light during its normal use, and to protect the surface of the plate from damage when the plate assembly is stored. Although the xerographic plate may be formed of various compositions and in various sizes, the type most commonly used at present comprises a conductive metallic backing plate having a surface coating of photoconductive material, wherein the exposed surface of the backing plate constitutes an area that is aproximately 10½" wide by 15½" long, and the photoconductive coating formed thereon covers the entire central area of the plate with the exception of a marginal area adjacent the inner edges of the rectangular frame member. The marginal area is usually on the order of ¾" in width and extends completely around the photoconductive area, thereby leaving a usable photoconductive area of approximately 9" x 14". It is to be understood that the above-mentioned dimensions are purely illustrative of a conventional type of apparatus and are not to be considered in a limiting sense, since it is apparent that such plate assemblies may be made in any desired size and may or may not be provided with the uncoated marginal area.

Figure 1:
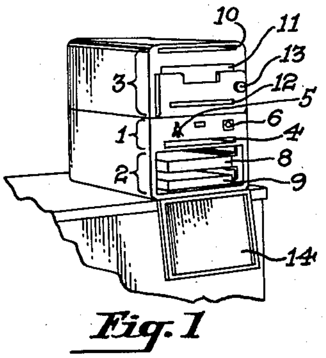
Fig. 1 is an isometric view of a xerographic machine with which the method of the invention may be practiced.

In conventional xerographic practice, the charging, developing, and transferring operations are usually carried out in a xerographic processing device of the type shown in Fig. 1 which illustrates a XeroX Processor, Model D, manufactured by The Haloid Company, of Rochester, New York. This device is an adaptation of that disclosed in Sabel et al. Patent 2,600,580, issued June 17, 1952, and includes a charging and image transferring unit 1, a developing unit 2, and a storage unit 3. The charging and transferring unit includes a support for a xerographic plate assembly, onto which the xerographic plate assembly may be inserted through a slot 4. A corona discharge device is mounted within the unit for applying electrostatic charge to the surface of the plate assembly. The charging device is usually in the form of a discharge electrode extending laterally across the machine and is mounted for longitudinal movement over the face of the plate by a suitable lead screw and crosshead mechanism. The discharge electrode may be energized by means of a three position switch 5 to apply either positive or negative corona to the surface of the plate. Automatic control of the charging mechanism may be had by means of a switch 6 which concomitantly energizes the electrode and initiates the operation of the lead screw and crosshead mechanism to cause the electrode to traverse the entire surface of a plate assembly that has been inserted in slot 4.

The developing unit of the processor usually includes a "line" tray 8, adapted for conventional line copy development, and a "tone" tray 9, adapted for solid area coverage, each containing an electroscopic powder or developing agent, which may be employed selectively depending on the type of development that is to be effected. Each developing tray is mounted on extensible brackets whereby the tray may be pulled forwardly to a position in which it can be rotated about suitable pivots without interference with the remainder of the machine. When so positioned, an exposed xerographic plate assembly may be clamped to the developing tray and developed by cascade, in conventional manner.

The developing material employed may be of any convenient type suitable to the requirements of a particular application. For example, the developing material may be of the type disclosed in Walkup Patent 2,618,551, issued November 18, 1952, wherein a pigmented powdered resin is combined with coated glass bead carriers and is thereby triboelectrically charged to a polarity opposite to that of the electrostatic latent image to be developed. Subsequently, the combined material is cascaded over the latent image whereby the resin particles are caused to adhere electrostatically to the charged portions of the image. Various other pigmented resins, usually having a polystyrene base, are available to suit specific applications.

The storage unit of the processor includes an upper storage bin for holding xerographic plate assemblies. The plate assemblies are inserted into the bin through an upper slot 10, and may be withdrawn from the bin through a slot 11. The lower portion of the storage area includes a storage bin for paper or other support material to which the xerographic powder image may be transferred. The support material is withdrawn from the bin through a slot 12 when urged forwardly by a suitable impeller actuated by a handle 13. A hinged cover 14 is provided to enclose the charging and developing units when the apparatus is not in use.

Figure 2:
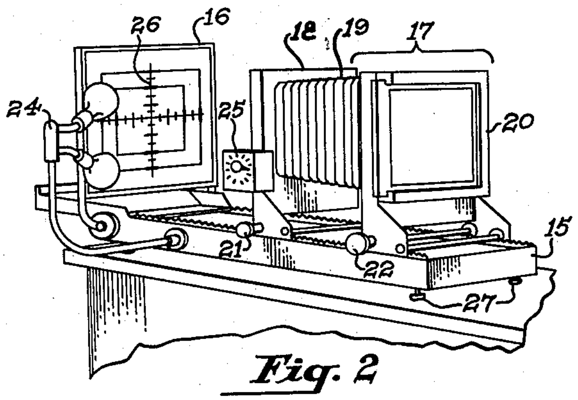
Fig. 2 is an isometric view of a xerographic camera.

In order to form an electrostatic latent image of a subject to be reproduced on the photoconductive layer of a xerographic plate assembly, the plate assembly is exposed in a camera which may be of the type illustrated in Fig. 2, namely a XeroX Camera No. 4, manufactured by The Haloid Company, of Rochester, New York. Essentially, such a camera comprises a base frame 15, a copyboard 16, mounted at one end thereof, and a camera generally designated by reference character 17. The camera assembly comprises a conventional lens mount 18, extensible bellows 19, and plate supporting frame 20 for supporting a ground glass focusing screen or a xerographic plate assembly in the focal plane of the camera. The camera elements may be variously positioned on the base frame, by means of adjusting screws 21 and 22, to effect any desired enlargement or reduction of the copy to be reproduced. Suitable lights 24 are arranged on the frame assembly for illuminating the copyboard under control of a timing switch 25.

In order to obtain accurate registration of subject material on the xerographic plate assembly, the camera is adjusted at installation so that grid markings 26 that are formed on the copyboard are made to coincide with similar markings formed on the ground glass focusing screen. When the proper adjustments are established, any subject material that is centered on the copyboard with reference to grid markings 26 will have its image projected to be similarly centered on the xerographic plate assembly when plate a exposed. Rotational registration of support member 20 with reference to grid markings 26 may be effected by means of leveling screws 27.

In the conventional operation of the above-described equipment for the preparation of xerocopies, a xerographic plate assembly is inserted in slot 4 of the processing apparatus of Fig. 1, the dark slide of the assembly is removed, and switch 6 is operated to cause a uniform electrostatic charge to be deposited upon the photoconductive surface of the plate assembly. After charging, the dark slide is reinserted in the plate assembly and the entire plate assembly is inserted in plate holding mount 20 of the camera (Fig. 2). Then, assuming that the camera is properly focused with reference to subject material placed on the copyboard, a timed exposure is made to effect the discharge of the electrostatic charges formed on the exposed area of the xerographic plate. After the exposure is complete, the dark slide is replaced in the xerographic plate assembly and the entire plate assembly is removed from the camera and is placed face down in juxtaposition to one of the developing trays 8 or 9 in the processing unit (Fig. 1). The dark slide is again removed from the plate assembly, and the plate assembly is clamped to the developing tray and developed by cascading the developing agent or powder in the tray over the surface of the plate. By this action, the powder particles of the developing agent are electrostatically attracted to the image portions of the electrostatic latent image previously formed on the photoconductive surface of the xerographic plate assembly so that, when development is complete, a reverse reading powder particle image or xerographic powder image of the subject material is formed on such photoconductive surface.

At this point in the conventional process, the operator is obliged to position a piece of paper or other support material over the xerographic powder image on the photoconductive surface of the plate assembly and then, electrostatically transfer the powder image to the surface of the paper. Normally, this is accomplished by manually aligning the paper or support material with the xerographic powder image and superposing the paper thereon. Thereafter, the xerographic plate assembly with the support material superposed on the powder image thereon, is again inserted into slot 4 of the processing unit. This may be effected in conjunction with a concomitant operation of switch 5, whereby the support material is electrostatically charged as it passes beneath the corona charging device to attract the xerographic powder image from the surface of the plate and cause it to adhere to the under surface of the support material. Alternatively, the xerographic plate assembly with the support material superposed thereon may be inserted completely in slot 4 and switch 6 may then be actuated to effect an automatic application of charge to the support material. In either case the powder image is thereupon electrostatically bonded to the support material and adheres thereto while the support material is separated from the plate assembly. If desired, the xerographic powder image may subsequently be fused to the support material by any suitable means whereby a permanent visible reproduction of the subject material is formed on the support material.

In conventional applications of the xerographic process for reproduction of printed copy and the like, the developing agent is usually selected to produce optimum results from the standpoint of triboelectric charging of the toner particles, acceptability of the final image, cleaning of the plate, and ease and convenience of handling and storage, etc. The particular type of toner particle and the ratio in which it is used with reference to the carrier particles may be varied within reasonable limits to produce various effects in accordance with the particular type of reproduction process involved. In general, the toner particles are used in a weight ratio of approximately 1 to 100 to the carrier particles.

When powder images formed of such toner particles are transferred to paper or other supports, a residual powder image always remains on the xerographic plate after transfer. Quantitatively, this residual image may constitute from ten to fifty percent of the original powder image, the variations being dependent on the type of final copy desired, temperature and humidity conditions, etc. In any given application, the percentage of toner employed in a given developing agent may be varied at will to produce acceptable copy. However, the requirements for legibility and acceptability in the reproduction of printed copy are much less stringent than the requirements for acceptability of a chemical resist.

In the former case, minute voids in the final image are acceptable as long as they are not of sufficient size to be visible by reflected light. In the case of chemical resists, however, such voids are obviously detrimental to the final product and cannot be tolerated. Therefore, when the xerographic process is applied to the formation of chemical resists, the developing agent is "over-toned" to an extent approximately to double the amount of toner employed in a given quantity of developing material. This results in forming an extremely dense powder image when the electrostatic latent image on the xerographic plate is developed. Such in image, if transferred in toto, would, by the nature of the toner material, form a coherent void-free resist on the support surface after fusing. However, as the quantity of toner is increased, the amount of powder remaining in the residual image after transfer also increases. In order to form a sufficiently dense powder image on the transfer surface to serve as a chemical resist, the present invention provides a transfer method whereby substantially the entire toner image formed on the xerographic plate may be transferred to the support surface.

In the practice of this method an electrostatic latent image of the desired resist pattern is formed on a xerographic plate by conventional means, as described above. Thereafter, the latent image is developed with an "overtoned" developing agent to form an extremely dense powder image corresponding to the latent image on the xerographic plate. When the chemical resist is to be formed on a metallic surface, such as a copper laminate commonly used in the manufacture of printed circuits, the transfer of the powder image to the metallic surface is effected by means of an intermediate transfer sheet, by a modification of the method described in Copley Patent 2,637,651, issued May 5, 1953.

To do this, a sheet of thin transfer paper, preferably of the onion skin variety, is superposed on the powder image on the xerographic plate. The plate is then inserted in charging slot 4 of a xerographic processor, as shown in Fig. 1, and switch 5 or 6 is manipulated to apply a positive charge to the entire surface of the paper, whereby the bulk of the powder image is electrostatically transferred to the intermediate transfer sheet, and the entire transfer sheet is electrostatically "tacked" to the plate. The xerographic plate 30 (see Fig. 3) is then withdrawn from the charging slot to an extent such that its rear edge is just held by the slot. The transfer sheet 31 is then peeled off the area on which the powder image is formed, but a portion 32 of the sheet on which no image appears is permitted to remain electrostatically tacked to the xerographic plate. When this is done, a high percentage of the powder image 33 adheres to the surface of the transfer sheet and a portion of the powder image, or residual image 34, remains on the xerographic plate.

Figure 3:
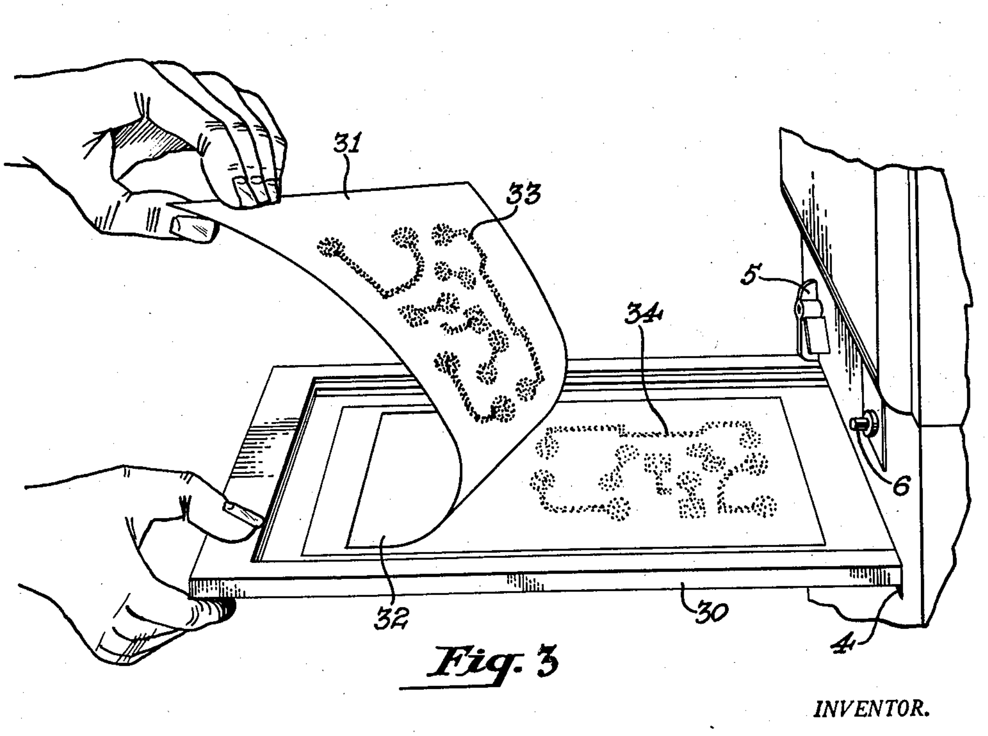
Fig. 3 is a perspective view illustrating an operational step in the method of the invention.

With sheet 31 held in the position shown in Fig. 3, plate 30 is then reinserted into charging slot 4 and switch 5 is manipulated to apply a negative charge to the surface of residual powder image 34. The plate is then withdrawn and transfer sheet 31, with the partial powder image 33 thereon, is again superposed on the area of the xerographic plate that it originally occupied. By leaving portion 32 of transfer sheet 31 electrostatically tacked to plate 30 during the preceding operation, exact registration of the powder image 33 with residual powder image 34 is assured. Plate 30 is then reinserted in charging slot 4 and switch 5 or 6 is manipulated to apply a positive charge to the surface of sheet 31. This positive charge is effective electrostatically to attract substantially all of the negatively charged powder particles of residual image 34 to sheet 31, whereby the residual image is transferred additively to the partial powder image already on the transfer sheet. Thereafter, plate 30 is withdrawn from the processor and transfer sheet 31 is separated therefrom. By this technique, substantially the entire powder image originally formed on xerographic plate 30 is electrostatically transferred and bonded to intermediate transfer sheet 31 to form an extremely dense powder image thereon.

The powder image on the transfer sheet may then conveniently be transferred to a final support surface, such as a copper-clad laminate, by means of electrostatic transfer. Preferably, this is accomplished with the aid of a "bare" plate assembly, i.e., a plate assembly comprising an uncoated conductive plate mounted in a wooden frame or cassette, that is adapted to slide in the charging slot 4 of the processor shown in the drawings, in the same manner as the xerographic plate assembly, described above.

The copper-clad laminate is placed on the conductive surface of the bare plate assembly, and the copper surface of the laminate is electrically grounded by any convenient means. The intermediate transfer sheet with the powder image thereon is then placed on the copper-clad laminate, with the powder image in contact with the copper surface of the laminate. The plate assembly is then inserted in charging slot 4 of the processor and switch 5 is manipulated to apply negative charge to the surface of the transfer sheet, whereby the powder image is repelled from the transfer sheet and is caused to adhere electrostatically to the copper surface of the laminate. The plate assembly is then removed from the processor and the intermediate transfer sheet is peeled off the surface of the laminate, leaving the powder image thereon.

The powder image may then be fused to the surface of the laminate by exposing the assembly to the vapor of a solvent for at least one of the constituents of the toner particles of the powder image, as described in co-pending application Serial No. 299,673, filed in the name of Chester F. Carlson on July 18, 1952, now Patent No. 2,776,907, issued January 8, 1957. The laminate and powder assembly are held in the vapor atmosphere for a period of ten to twenty seconds to effect complete fusing of the toner particles and firm bonding thereof to the surface of the laminate, whereby a completely impervious chemical resist is formed thereon.

Thereafter, the assembly may be immersed in a fifty percent solution of ferric chloride, as in conventional printed circuit practice, for a sufficient period to remove the unprotected portion of the copper foil on the laminate. When this is done the laminate is cleaned by removing the fused powder image by means of a suitable solvent for the fused toner particles. The resultant surface of the laminate then comprises a conductive, photographic reproduction of the wiring pattern to be reproduced, and may be employed in conventional manner as a printed circuit or wiring board.

If desired, the foregoing process may be further modified by negatively charging the powder image on the transfer sheet before it is superposed on the metallic surface of the laminate, and thereafter negatively charging the opposite surface of the transfer sheet to effect transfer of the powder image, as described above. It may be noted that this step is not essential in the normal operation of the method of the invention, but may be found desirable, with certain types of toners, to insure complete transfer. In addition, fusing of the toner image to the laminate may also be effected by heat, if desired. In this case it is preferred that the heat be applied in a manner not to soften or otherwise injure the substrate material of the laminate, as, for example, by rapid exposure to infrared radiation.

Thus far, the explanation of the invention has been directed primarily to the application of xerographic techniques to the preparation of printed circuits or wiring boards, in which an intermediate transfer is required. However, it is apparent that the powder image may be transferred directly from the surface of the xerographic plate to any flexible non-metallic support surface, by the method of the invention, without the use of an intermediate transfer sheet. When this is done, the negative charging of the residual image and additive transfer of the residual image to the partial powder image on the support surface, as described above, is found to provide a sufficiently dense powder pattern on the support surface to form a chemical resist that is suitable for substantially all conventional applications.

Since a number of different types of instrumentalities and techniques may be employed in carrying out the method of invention, and since widely differing applications of the invention may be made without departing from the scope thereof, it is intended that all matter contained in the above description shall be construed as illustrative, and that the invention be limited only as defined in the following claims.

What is claimed is:

1. The method of forming a predetermined pattern of resist material on a support surface comprising the steps of forming an electrostatic latent image of the pattern on a xerographic plate, developing the latent image with a powdered resist material to form a powder image of the pattern on the plate, superposing an intermediate transfer sheet on the powder image, electrostatically transferring the bulk of the powder image to the transfer sheet, separating the transfer sheet and the powder image thereon from the xerographic plate to an extent to expose the residual powder image on the plate, electrostatically charging the residual powder image to a polarity opposite to that employed in the transfer step, again superposing the transfer sheet on the residual powder image, electrostatically transferring the residual powder image to the transfer sheet, separating the transfer sheet with the complete powder image thereon from the plate, and transferring the powder image to a support surface.

2. The method of forming a predetermined pattern of resist material on a support surface comprising the steps of forming an electrostatic latent image of the pattern on a xerographic plate, developing the latent image with a powdered resist material to form a powder image of the pattern on the plate, superposing an intermediate transfer sheet on the powder image, electrostatically transferring the bulk of the powder image to the transfer sheet, separating the transfer sheet and the powder image thereon from the xerographic plate to an extent to expose the residual powder image on the plate, electrostatically charging the residual powder image to a polarity opposite to that employed in the transfer step, again superposing the transfer sheet on the residual powder image, electrostatically transferring the residual powder image to the transfer sheet, separating the transfer sheet with the complete powder image thereon from the plate, superposing the transfer sheet on a support surface with the powder image in contact with such surface, and transferring the powder image to the support surface.

3. The method of forming a predetermined pattern of resist material on a support surface comprising the steps of forming an electrostatic latent image of the pattern on a xerographic plate, developing the latent image with a powdered fusible resist material to form a powder image of the pattern on the plate, superposing an intermediate transfer sheet on the powder image, electrostatically transferring the bulk of the powder image to the transfer sheet, separating the transfer sheet and the powder image thereon from the xerographic plate to an extent to expose the residual powder image on the plate, electrostatically charging the residual powder image to a polarity opposite to that employed in the transfer step, again superposing the transfer sheet on the residual powder image, electrostatically transferring the residual powder image to the transfer sheet, separating the transfer sheet with the complete powder image thereon from the plate, superposing the transfer sheet on a support surface with the powder image in contact with such surface, transferring the powder image to the support surface, and fusing the powder image thereon.

4. The method of forming a pattern of chemically inert plastic on a support surface comprising the steps of forming an electrostatic latent image of the pattern on a xerographic plate, developing the latent image with a chemically inert plastic powder to form a powder image of the pattern on the plate, superposing an intermediate transfer sheet on the powder image, positively charging the transfer sheet while in contact with the plate to effect electrostatic transfer of the bulk of the powder image to the transfer sheet, separating the transfer sheet with the powder image thereon from the xerographic plate, negatively charging the residual powder image on the plate, again superposing the transfer sheet on the plate with the powder image thereon in register with the residual powder image, positively charging the transfer sheet to effect electrostatic transfer of the residual powder image to the transfer sheet, separating the transfer sheet with the complete powder image hereon from the plate, and transferring the powder image to a support surface.

5. The method of forming a pattern of chemically inert plastic on a support surface comprising the steps of forming an electrostatic latent image of the pattern on a xerographic plate, developing the latent image with a chemically inert plastic powder to form a powder image of the pattern on the plate, superposing an intermediate transfer sheet on the powder image, positively charging the transfer sheet while in contact with the plate to effect electrostatic transfer of the bulk of the powder image to the transfer sheet, separating the transfer sheet with the powder image thereon from the xerographic plate, negatively charging the residual powder image on the plate, again superposing the transfer sheet on the plate with the powder image thereon in register with the residual powder image, positively charging the transfer sheet to effect electrostatic transfer of the residual powder image to the transfer sheet, separating the transfer sheet with the complete powder image thereon from the plate, superposing the transfer sheet on a support surface with the powder image in contact with such surface, and transferring the powder image to the support surface.

6. The method of forming a pattern of chemically inert plastic on a support surface comprising the steps of forming an electrostatic latent image of the pattern on a xerographic plate, developing the latent image with a chemically inert fusible plastic powder to form a powder image of the pattern on the plate, superposing an intermediate transfer sheet on the powder image, positively charging the transfer sheet while in contact with the plate to effect electrostatic transfer of the bulk of the powder image to the transfer sheet, separating the transfer sheet with the powder image thereon from the xerographic plate, negatively charging the residual powder image on the plate, again superposing the transfer sheet on the plate with the powder image thereon in register with the residual powder image, positively charging the transfer sheet to effect electrostatic transfer of the residual powder image to the transfer sheet, separating the transfer sheet with the complete powder image thereon from the plate, superposing the transfer sheet on a support surface with the powder image in contact with such surface, transferring the powder image to the support surface, and fusing the powder image thereon.

7. The method of forming a conductive network of predetermined pattern on a support surface comprising the steps of forming an electrostatic latent image of the pattern on a xerographic plate, developing the latent image with a powdered resist material to form a powder image of the pattern on the plate, superposing an intermediate transfer sheet on the powder image, electrostatically transferring the bulk of the powder image to the transfer sheet, separating the transfer sheet and the powder image thereon from the xerographic plate to an extent to expose the residual powder image on the plate, electrostatically charging the residual powder image to a polarity opposite to that employed in the transfer step, again superposing the transfer sheet on the residual powder image, electrostatically transferring the residual powder image to the transfer sheet, separating the transfer sheet with the complete powder image thereon from the plate, transferring the powder image to the conductive surface of a conductively clad support, fixing the powder image in contact with the conductive surface, and etching the exposed areas of the conductive coating to remove such exposed areas.

8. The method of forming a conductive network of predetermined pattern on a support surface comprising the steps of forming an electrostatic latent image of the pattern on a xerographic plate, developing the latent image with a powdered resist material to form a powder image of the pattern on the plate, superposing an intermediate transfer sheet on the powder image, electrostatically transferring the bulk of the powder image to the transfer sheet, separating the transfer sheet and the powder image thereon from the xerographic plate to an extent to expose the residual powder image on the plate, electrostatically charging the residual powder image to a polarity opposite to that employed in the transfer step, again superposing the transfer sheet on the residual powder image, electrostatically transferring the residual powder image to the transfer sheet, separating the transfer sheet with the complete powder image thereon from the plate, transferring the powder image to the conductive surface of a conductively clad support, fixing the powder image in contact with the conductive surface, etching the exposed areas of the conductive coating on the support to remove such exposed areas, and removing the powder image from the remainder of the conductive surface.

9. The method of forming a conductive network of predetermined pattern on a support surface comprising the steps of forming an electrostatic latent image of the pattern on a xerographic plate, developing the latent image with a powdered resist material to form a powder image of the pattern on the plate, superposing an intermediate transfer sheet on the powder image, electrostatically transferring the bulk of the powder image to the transfer sheet, separating the transfer sheet and the powder image thereon from the xerographic plate to an extent to expose the residual powder image on the plate, electrostatically charging the residual powder image to a polarity opposite to that employed in the transfer step, again superposing the transfer sheet on the residual powder image, electrostatically transferring the residual powder image to the transfer sheet, separating the transfer sheet with the complete powder image thereon from the plate, superposing the transfer sheet on a conductively clad support with the powder image in contact with the conductive surface of the support, transferring the powder image to the conductive surface of the support, fixing the powder image in contact with the conductive surface, etching the exposed areas of the conductive coating on the support to remove such exposed areas, and removing the powder image from the remainder of the conductive surface.

10. The method of forming a pattern of chemically inert plastic on a support surface comprising the steps of forming an electrostatic latent image of the pattern on a xerographic plate, developing the latent image with a chemically inert plastic powder to form a powder image of the pattern on the plate, superposing the support surface on the powder image, positively charging the support surface while in contact with the plate to effect electrostatic transfer of the bulk of the powder image to the support surface, separating the support surface with the partial powder image thereon from the xerographic plate, negatively charging the residual powder image on the plate, again superposing the support surface on the plate with the partial powder image in register with the residual powder image, positively charging the support surface to effect electrostatic transfer of the residual powder image to the support surface, and separating the support surface with the complete powder image thereon from the plate.

11. The method of forming a pattern of chemically inert plastic on a support surface comprising the steps of forming an electrostatic latent image of the pattern on a xerographic plate, developing the latent image with a chemically inert fusible plastic powder to form a powder image of the pattern on the plate, superposing the support surface on the powder image, positively charging the support surface while in contact with the plate to effect electrostatic transfer of the bulk of the powder image to the support surface, separating the support surface with the partial powder image thereon from the xerographic plate, negatively charging the residual powder image on the plate, again superposing the support surface on the plate with the partial powder image in register with the residual powder image, positively charging the support surface to effect electrostatic transfer of the residual powder image to the support surface, separating the support surface with the complete powder image thereon from the plate, and fusing the powder image on the support surface.

12. In the manufacture of printed circuits in which a conductive network of predetermined pattern is to be formed on a support surface by forming a pattern of resist material corresponding to the predetermined pattern on a conductively coated support and etching away the exposed areas of the conductive coating, the method of forming the resist material pattern on the conductively coated support comprising the steps of forming an electrostatic latent image of the pattern on a xerographic plate, developing the latent image with a powdered resist material to form a powder image of the pattern on the plate, superposing an intermediate transfer sheet on the powder image, electrostatically transferring the bulk of the powder image to the transfer sheet, separating the transfer sheet and the powder image thereon from the xerographic plate to an extent to expose the residual powder image on the plate, electrostatically charging the residual powder image to a polarity opposite to that employed in the transfer step, again superposing the transfer sheet on the residual powder image, electrostatically transferring the residual powder image to the transfer sheet, separating the transfer sheet with the complete powder image thereon from the plate, and transferring the powder image to the surface of a conductively coated support material.

13. In the manufacture of printed circuits in which a conductive network of predetermined pattern is to be formed on a support surface by forming a pattern of resist material corresponding to the predetermined pattern on a conductively coated support and etching away the exposed areas of the conductive coating, the method of forming the resist material pattern on the conductively coated support comprising the steps of forming an electrostatic latent image of the pattern on a xerographic plate, developing the latent image with a powdered resist material to form a powder image of the pattern on the plate, superposing an intermediate transfer sheet on the powder image, electrostatically transferring the bulk of the powder image to the transfer sheet, separating the transfer sheet and the powder image thereon from the xerographic plate to an extent to expose the residual powder image on the plate, electrostatically charging the residual powder image to a polarity opposite to that employed in the transfer step, again superposing the transfer sheet on the residual powder image, electrostatically transferring the residual powder image additively to the powder image on the transfer sheet, separating the transfer sheet with the complete powder image thereon from the plate, and transferring the powder image to the surface of a conductively coated support material.

14. In the manufacture of printed circuits in which a conductive network of predetermined pattern is to be formed on a support surface by forming a pattern of resist material corresponding to the predetermined pattern on a conductively coated support and etching away the exposed areas of the conductive coating, the method of forming the resist material pattern on the conductively coated support comprising the steps of forming an electrostatic latent image of the pattern on a xerographic plate, developing the latent image with a powdered resist material to form a powder image of the pattern on the plate, superposing an intermediate transfer sheet on the powder image, electrostatically transferring the bulk of the powder image to the transfer sheet, separating the transfer sheet and the powder image thereon from the xerographic plate to an extent to expose the residual powder image on the plate, electrostatically charging the residual powder image to a polarity opposite to that employed in the transfer step, again superposing the transfer sheet on the residual powder image, electrostatically transferring the residual powder image additively to the powder image on the transfer sheet, separating the transfer sheet with the complete powder image thereon from the plate, electrostatically charging the combined powder image on the transfer sheet, and electrostatically transferring the powder image to the surface of a conductively coated support material.

References Cited in the file of this patent

UNITED STATES PATENTS

| | | |
|---|---|---|
| 2,297,691 | Carlson | Oct. 6, 1942 |
| 2,576,047 | Schaffert | Nov. 20, 1951 |
| 2,637,651 | Copley | May 5, 1953 |
| 2,681,473 | Carlson | June 22, 1954 |
| 2,756,676 | Steinhilper | July 31, 1956 |